United States Patent
Konrath et al.

(10) Patent No.: US 11,024,502 B2
(45) Date of Patent: Jun. 1, 2021

(54) SEMICONDUCTOR DEVICES AND METHODS FOR FORMING SEMICONDUCTOR DEVICES

(71) Applicant: Infineon Technologies AG, Neubiberg (DE)

(72) Inventors: Jens Peter Konrath, Villach (AT); Jochen Hilsenbeck, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/419,377

(22) Filed: May 22, 2019

(65) Prior Publication Data
US 2019/0362976 A1 Nov. 28, 2019

(30) Foreign Application Priority Data
May 23, 2018 (DE) .......................... 102018112378.7

(51) Int. Cl.
*H01L 21/266* (2006.01)
*H01L 21/033* (2006.01)
(Continued)

(52) U.S. Cl.
CPC ........ *H01L 21/266* (2013.01); *H01L 21/0337* (2013.01); *H01L 29/107* (2013.01);
(Continued)

(58) Field of Classification Search
CPC H01L 21/0337; H01L 21/266; H01L 21/0465
See application file for complete search history.

(56) References Cited

U.S. PATENT DOCUMENTS

| 5,198,692 A * | 3/1993 | Momose ............. H01L 21/0271 257/557 |
| 2014/0273370 A1 | 9/2014 | Gerhardt et al. |
| 2015/0372075 A1* | 12/2015 | Fragapane .......... H01L 29/0615 257/77 |

FOREIGN PATENT DOCUMENTS

| DE | 3920585 A1 | 2/1990 |
| DE | 102007052220 A1 | 5/2009 |
| DE | 102015120272 A1 | 6/2016 |

OTHER PUBLICATIONS

Oosterhoff, Distributions of Boron and Phosphorus Implanted in Silicon in the Energy Range 0.1-1.5 MeV, Nuclear Instruments and Methods in Physics Research B30 (1988) 1-12 (Year: 1988).*
(Continued)

*Primary Examiner* — Shih Tsun A Chou
(74) *Attorney, Agent, or Firm* — Murphy, Bilak & Homiller, PLLC

(57) ABSTRACT

A method for forming a semiconductor device includes forming a mask layer with a first implantation window on a semiconductor substrate and implanting dopants with a first implantation energy into the semiconductor substrate through the first implantation window to form a first portion of a doping region of the semiconductor device. The mask layer is adapted to form a second implantation window of the mask layer. Further, dopants are implanted with a second implantation energy into the semiconductor substrate through the second implantation window. The second implantation energy differs from the first implantation energy and a lateral dimension of the first implantation window differs from a lateral dimension of the second implantation window.

17 Claims, 5 Drawing Sheets

(51) Int. Cl.
  *H01L 29/10*   (2006.01)
  *H01L 29/16*   (2006.01)
  *H01L 29/861*   (2006.01)
  *H01L 29/78*   (2006.01)

(52) U.S. Cl.
  CPC ...... *H01L 29/1608* (2013.01); *H01L 29/7802* (2013.01); *H01L 29/8611* (2013.01)

(56) References Cited

OTHER PUBLICATIONS

Chenming Hu, Modern Semiconductor Devices for Integrated Circuits, Pearson; 1st edition (Apr. 1, 2009), Chapter 8 (Year: 2009).*
Janson et al., Ion implantation range distributions in silicon carbide, Journal of Applied Physics 93, 8903 (2003) (Year: 2003).*
Jurukawa et al., Theoretical Considerations on Lateral Spread of Implanted ions, Japanese Journal of Applied Physics, vol. 11, No. 2, Feb. 1972 (Year: 1972).*
Bartolf, Holger, et al., "Development of a 60 urn Deep Trench and Refill Process for Manufacturing Si-Based High-Voltage Super-Junction Structures", IEEE Transactions on Semiconductor Manufacturing; vol. 26, No. 4, Nov. 2013, pp. 529-541.

* cited by examiner

SEMICONDUCTOR DEVICES AND METHODS FOR FORMING SEMICONDUCTOR DEVICES

TECHNICAL FIELD

Presented examples relate to semiconductor devices and methods for forming semiconductor devices.

BACKGROUND

Forming semiconductor devices may include ion implantation. For example, dopants can be implanted into a semiconductor substrate with different implantation energies. A doping region formed by implanting dopants can have a varying lateral extension and the lateral extension can depend on a distance to a surface of the semiconductor substrate. The varying lateral extension results in a non-uniform vertical boundary of the doping region, for example. There may be a desire for improved concepts for implanting dopants into semiconductor substrates.

SUMMARY

An example relates to a method for forming a semiconductor device. The method comprises forming a mask layer comprising a first implantation window on a semiconductor substrate. The method further comprises implanting dopants into the semiconductor substrate with a first implantation energy through the first implantation window to form a first portion of a doping region of the semiconductor device. The mask layer is adapted to form a second implantation window of the mask layer and dopants are implanted with a second implantation energy into the semiconductor substrate through the second implantation window to form a second portion of the doping region of the semiconductor device. The second implantation energy differs from the first implantation energy, and a lateral dimension of the first implantation window differs from a lateral dimension of the second implantation window.

A further example relates to a method for forming a semiconductor device comprising forming a first mask layer on a semiconductor substrate. The first mask layer comprises a first implantation window. The method further comprises implanting dopants with a first implantation energy into the semiconductor substrate through the first implantation window to form a first portion of a doping region of the semiconductor substrate. A second mask layer is formed on the semiconductor substrate. The second mask layer comprises a second implantation window differing from the first implantation window. Dopants are implanted with a second implantation energy into the semiconductor substrate through the second implantation window to form a second portion of the doping region of the semiconductor substrate. A difference between a lateral dimension of the second implantation window and a lateral dimension of the first implantation window is selected depending on a difference between the second implantation energy and the first implantation energy.

An example relates to a semiconductor device comprising a semiconductor substrate and a doping region located within the semiconductor substrate. A vertical extension of a vertical portion of the doping region is larger than 300 nm. A minimal lateral dimension of the doping region within the vertical portion of the doping region in a vertical cross-sectional area of the doping region is at least 90% of an average lateral dimension within the vertical portion of the doping region and a maximal lateral dimension of the doping region within the vertical portion of the doping region is at most 110% of the average lateral dimension of the doping region within the vertical portion of the doping region.

Those skilled in the art will recognize additional features and advantages upon reading the following detailed description, and upon viewing the accompanying drawings.

BRIEF DESCRIPTION OF THE FIGURES

Some examples of apparatuses and/or methods will be described in the following by way of example only, and with reference to the accompanying figures, in which.

DETAILED DESCRIPTION

Figure 1:
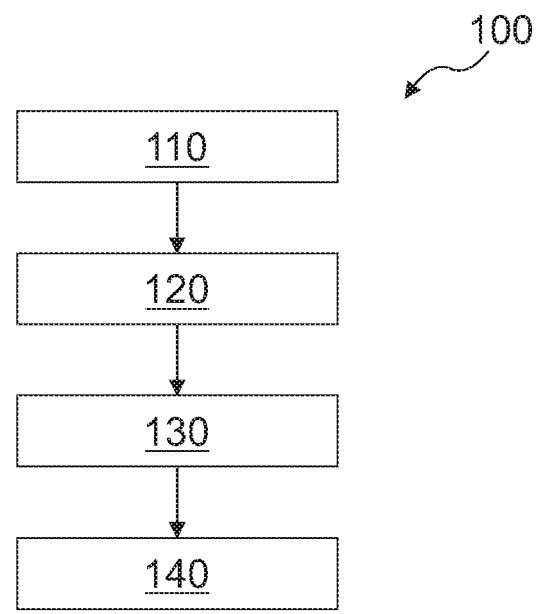
FIG. 1 shows a flow chart of a method for forming a semiconductor device comprising providing a mask layer on a semiconductor substrate and adapting the mask layer.

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Same or like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B, if not explicitly or implicitly defined otherwise. An alternative wording for the same combinations is "at least one of A and B" or "A and/or B". The same applies, mutatis mutandis, for combinations of more than two Elements. Furthermore, if an element (e.g., a layer or a mask) is "on" (e.g., positioned "on") a further element, this does not necessarily mean that said element is positioned "directly on" said further element. Rather, a further component (e.g., a further layer) may be positioned in between said element and said further element.

The terminology used herein for the purpose of describing particular examples is not intended to be limiting for further examples. Whenever a singular form such as "a," "an" and "the" is used and using only a single element is neither explicitly nor implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

When implanting dopants into a wide band gap semiconductor substrate, in particular a silicon carbide substrate, via a mask layer by means of ion implantation, e.g. in contrast to a silicon substrate, foreign atoms may no longer be moved within the semiconductor by means of diffusion. Therefore, multiple implants may have to be executed for manufacturing a homogenous implant (e.g. a quasi-box profile, perpendicular to the semiconductor surface). Also, with an activation at a temperature of 1800° C., e.g. diffusion might not occur with some dopants (e.g. nitride (N), aluminum (Al)).

Ion implantation into semiconductor materials may cause lateral straggling. An expansion of a doping region in lateral direction may increase with increasing implantation energy. If the implantation is executed with several different implantation energies via a same mask, e.g. with a same implantation window, a somewhat bellied implantation profile may result within the semiconductor substrate (as e.g. shown in FIG. 4).

Therefore, in some embodiments it is proposed to implant the individual implants depending on their implantation energy via a customized mask layer (e.g., a resist mask) so that the mask layer may compensate the lateral straggling, which e.g. increases with deeper implants. Consequently, sharper implantation profiles may be acquired.

FIG. 1 shows a flow chart of a method 100 for forming a semiconductor device comprising providing a mask layer and adapting the mask layer. The method 100 may comprise forming 110 a mask layer on a semiconductor substrate. The semiconductor substrate may comprise at least one of: a semiconductor wafer and an epitaxially grown semiconductor layer. The semiconductor substrate extends along a main extension plane in lateral directions. Perpendicular to the main extension plane, in a vertical direction, the semiconductor substrate may have a thickness that is small compared to an extension of the semiconductor substrate in the lateral directions.

The mask layer may comprise a first implantation window. For example, the mask layer may be provided at a front side surface of the semiconductor substrate. The mask layer may comprise a resist layer (e.g. photo resist), an oxide layer, a metal layer and/or a nitride layer or the mask layer may consist of one of the mentioned layers. Forming 110 the mask layer may comprise forming a layer on the semiconductor substrate and removing a part of the layer, for example by etching, to form the first implantation window.

The method 100 may comprise implanting 120 dopants. The dopants may be implanted with a first implantation energy into the semiconductor substrate through the first implantation window. The dopants may be implanted 120 while the mask layer is located on the semiconductor substrate after forming 110 the mask layer. The dopants may be implanted 120 to form a first portion of a doping region of the semiconductor device. For example, a maximal lateral extension of the first portion of the doping region may be larger than a maximal vertical extension of the first portion of the doping region.

The method 100 may further comprise adapting 130 the mask layer. The mask layer may be adapted 130 to form a second implantation window of the mask layer. A center position of the first implantation window may be equal to a center position of the second implantation window. The second implantation window may differ from the first implantation window regarding a lateral extension of the implantation window. In one example, adapting 130 the mask layer may comprise increasing or decreasing a lateral dimension of the first implantation window. For example, all edges of the implantation window may be equally altered or modified.

For example, a lateral dimension of the first implantation window may differ from a lateral dimension of the second implantation window. The two lateral dimensions may indicate a same geometric parameter of the implantation window, e.g. a length or width of the implantation window. For example, the lateral dimension of the first and/or second implantation window may be a width or a length of an edge of the first and/or second implantation window, if the first and/or second implantation window is rectangular-shaped or square-shaped in a lateral cross-section. Alternatively, the first and/or second implantation window may have an elliptical or a circular lateral cross-section and the lateral dimension of the first and/or second implantation window may be a radius of the first and/or second implantation window. The lateral dimension of the first implantation window and the lateral dimension of the second lateral dimension may be measured in the same direction in parallel to a front side surface of the semiconductor substrate (that is to say, along at least one of the lateral directions). For example, the first and second implantation windows are rectangular-shaped and the width and/or length of the second implantation window may differ from the width and/or length of the first implantation window.

The method 100 may further comprise implanting 140 dopants with a second implantation energy into the semiconductor substrate after adapting the mask layer. The dopants may be implanted 140 with a second implantation energy through the second implantation window of the mask layer. The dopants may be implanted 140 to form a second portion of the doping region of the semiconductor device, for example adjacent to the first portion of the doping region. In at least one example of the method 100, the dopants that are implanted 140 to form the second portion may be implanted through the first portion of the doping region.

Both the dopants implanted with the first implantation energy and the dopants implanted with the second implantation energy may be of a first conductivity type, which may be either n-type or p-type. In general, each implanted dopant, e.g. a dopant implanted with a third implantation energy, etc., may be of the first conductivity type. Alternatively, at least one of the dopants implanted with a different energy may be of a second conductivity type opposite the first conductivity type. For example, the dopants implanted with the first implantation energy may be of the first conductivity type and the dopants implanted with the second implantation energy may be of the second conductivity type.

The first conductivity type may be an n-type and the second conductivity type may be a p-type, or vice versa.

The doping region may be formed by at least the two implantations used to form the first and second portion, but more implantation processes through more implantation windows of different size may be used to form the complete doping region. If several implantation processes are implemented, each of the implantation processes may comprise implanting dopants with a respective implantation energy and/or through a respective implantation window.

In the case of at least three implantation processes, at least for two subsequent implantation processes the respective implantation energies and/or the respective implantation windows are different. However, it is possible that at least two implantation energies are equal or substantially equal. Moreover, at least two implantation windows may be equal. In a typical embodiment, in the case of at least three implantation processes, each of the respective implantation energies of an implantation process may be larger (or alternatively smaller) than the implantation energy of the directly succeeding implantation process. This applies, mutatis mutandis, to the size of the implantation window.

If the dopants are all of the first conductivity type, after implanting all portions of the doping region, the doping region may be a continuous region of the first conductivity type in the semiconductor substrate containing at least the first portion and the second portion formed by implanting through the first and second implantation window. If dopants of opposite conductivity types are implanted, the doping region may comprise at least one continuous region of the first conductivity type and at least one continuous region of the second conductivity type.

For example, the second implantation energy may differ from the first implantation energy. Consequently, a vertical distance between the second portion of the doping region and the surface of the semiconductor substrate may differ from a vertical distance between the first portion of the doping region and the surface of the semiconductor substrate. By using different implantation energies, a doping region having large vertical extension may be obtainable. For example, the first portion and second portion may be vertically adjacent to each other or the first portion and the second portion may partly overlap vertically.

Implanting dopants into the semiconductor substrate with different implantation energies may cause respectively different lateral straggling. For example, at higher implantation energies a lateral scattering of the implanted dopants may be larger compared to lower implantation energies. By providing adapted implantation windows of different lateral dimensions for implanting dopants with different implantation energies, the lateral extension of the implanted portions may be controlled, for example by considering lateral straggling depending on the implantation energy. By adapting the implantation window of the mask layer, it may be possible to increase a uniformity of the sidewalls or vertical boundaries of the doping region, for example.

For example, the second implantation energy may be lower than the first implantation energy. In this case, the lateral dimension of the second implantation window may be larger than the lateral dimension of the first implantation window. With lower implantation energy, an implantation depth of the dopants may be reduced. For example, the second portion of the doping region may be closer to the surface of the semiconductor substrate than the first portion of the doping region. A vertical distance of the first portion of the doping region to the front side surface of the semiconductor substrate may be larger than a vertical distance of the second portion of the doping region to the front side surface of the semiconductor substrate. Due to the lower implantation energy, lateral straggling of the dopants implanted 140 with the second implantation energy may be smaller than lateral straggling of the dopants implanted 120 with the first implantation energy.

Accordingly, the mask layer may be adapted 130 to achieve a more uniform lateral extension of the doping region, e.g. due to a similar lateral extension of the first portion and the second portion of the doping region. The mask layer may be adapted so that the lateral dimension of the second implantation window is larger than the lateral dimension of the first implantation window. The larger lateral dimension of the second implantation window may compensate the lower lateral straggling of the dopants implanted with the lower second implantation energy.

In another example, the second implantation energy may be higher than the first implantation energy. In this case, the lateral dimension of the second implantation window may be smaller than the lateral dimension of the first implantation window. Implanting with sequentially higher energies may lead to a different channeling by disruptions in the crystal structure of the lower energy implants.

For example, adapting 130 the mask layer may comprise etching the mask layer to increase the lateral dimension of the first implantation window to obtain the second implantation window. By this, a larger lateral dimension of the second mask window compared to the first mask window may be provided. For example, a part of the mask layer may be etched back to increase a lateral area of the implantation window of the mask layer. For example, isotropic etching may be used to adapt 130 the mask layer. For example, an oxygen (O2) plasma may be used for etching the mask layer, e.g. if the mask layer is a photo resist layer. In particular, treatment with oxygen plasma may result in incineration (also called: ashing), which corresponds to etching. Adapting 130 the mask layer may result in reduction of a thickness of the mask layer. For example, a thickness of the mask layer may be at least 1 μm (or at least 1.5 μm or at least 2 μm or at least 3 μm or at least 5 μm) and/or at most 10 μm (or at most 7 μm or at most 5 μm) before the adaptation 130 of the mask layer to obtain the second implantation window.

Alternatively, the mask layer may be adapted so that the lateral dimension of the second implantation window is smaller than the lateral dimension of the first implantation window. Accordingly, the second implantation energy may be larger than the first implantation energy. By providing a smaller implantation window at higher implantation energies, it may be possible to compensate stronger lateral straggling of the implanted dopants.

In another example, adapting 130 the mask layer may comprise forming a spacer at an edge of the first implantation window. By this, a second implantation window with a smaller lateral dimension than the lateral dimension of the first implantation window may be provided. Forming the spacer may enable to decrease the lateral dimension of the first implantation window to obtain the second implantation window. For example, for forming the spacer, an auxiliary layer may be deposited on the mask layer. The auxiliary layer may be etched back so that the spacer remains at the edges of the first implantation window. By controlling the thickness of the auxiliary layer and/or the etching, a width of the spacer and a size or lateral dimension of the second implantation window may be adjusted.

For example, a difference between the lateral dimension of the second implantation window and the lateral dimension of the first implantation window may be selected depending on a difference between the second implantation energy and the first implantation energy. The difference between the lateral dimension of the second implantation window and the lateral dimension of the first implantation window may be based on and/or correlate to and/or be proportional to the difference between the first implantation energy and the second implantation energy. For example, if the difference between the first implantation energy and the second implantation energy is increased, the difference between the lateral dimension of the first implantation window and the lateral dimension of the second implantation window may be increased as well.

The required lateral dimension of the respective implantation window may, however, be indirectly proportional to the implantation energy used. That is to say, if the first implantation energy is larger than the second implantation energy, the lateral dimension of the first implantation window may be smaller than the lateral dimension of the second implantation window and vice versa.

A relation between the difference of the implantation energies and the difference of the lateral dimensions may be non-linear. By adapting 130 the mask layer or the lateral dimension of the implantation window of the mask layer according to a difference between implantation energies, the effect of lateral straggling on the lateral extension of the doping region may be reduced, for example a more uniform lateral extension of the doping region may be achieved. For example, a maximal lateral dimension of the first portion of the doping region may differ from a maximal lateral dimension of the second portion of the doping region by less than 10% (or less than 5%, or less than 3%) of the maximal lateral dimension of the second portion of the doping region.

For example, the difference between the lateral dimension of the first implantation window and the lateral dimension of the second implantation window may be at least 10 nm (or at least 20 nm, at least 50 nm or at least 100 nm) and/or at most 500 nm (or at most 300 nm, and at most 200 nm, at most 100 nm or at most 50 nm).

For example, a lateral area of the second implantation window may contain a lateral area of the first implantation window. The first implantation window and the second implantation window may overlap at least in parts. For example, the second implantation window may be larger than the first implantation window and the second implantation window may completely contain the first implantation window. Alternatively, the first implantation window may be larger and contain the second implantation window, for example if the first implantation energy is lower than the second implantation energy.

The method 100 may further comprise adapting the mask layer to form a third implantation window of the mask layer. Dopants may be implanted into the semiconductor substrate with a third implantation energy through the third implantation window to form a third portion of the doping region of the semiconductor device e.g. in a third implantation process after the second implantation process. The dopants implanted with the third implantation energy may be of the first conductivity type or of the second conductivity type.

A difference between a lateral dimension of the third implantation window and the lateral dimension of the first implantation window (or second implantation window) may be selected depending on and/or may be based on and/or may correlate to and/or may be proportional to a difference between the third implantation energy and the first implantation energy (and/or second implantation energy). By forming the third portion, the vertical extension of the doping region may be increased. For example, the third implantation energy may differ from the first and second implantation energy.

A lateral dimension of the third implantation window may be chosen and/or adapted in a same or similar manner as for the second implantation window. That is to say, the disclosure herein with respect to the second implantation window applies, mutatis mutandis, to the third implantation window and vice versa. For example, as for the second implantation window, the lateral dimension of the third implantation window may differ from the lateral dimension of the first and the second implantation window. For example, the lateral dimension of the third implantation window may be larger or smaller than the both the lateral dimension of the first and second implantation window. Alternatively, the lateral dimension of the third implantation window may be larger than the lateral dimension of the first implantation window and smaller than the lateral dimension of the second implantation window. In the latter case, the third implantation energy may be smaller than the second implantation energy and larger than the first implantation energy. In another example, the lateral dimension of the third implantation window may be smaller than the lateral dimension of the first implantation window but larger than the lateral dimension of the second implantation window.

By providing a plurality of implantation processes to form corresponding doping portions, a doping region of a higher vertical extension may be formed while a uniformity of the vertical boundary of the doping region may be achieved. For example, at least two (or at least four) and/or at most eight (or at most six) implantation processes may be performed to form the doping region. In a typical example, at least three and at most seven implantation processes are performed. For example, at higher implantation energies, more implantation windows may be used than at lower implantation energies (e.g. within a predefined implantation energy) as lateral straggling becomes stronger at higher implantation energies, for example. For example, a number of lateral minima and/or lateral maxima of the doping region may correlate with a number of performed implantation processes. By performing more implantation processes for a doping region of a predefined vertical extension, a uniformity of the vertical boundary of the doping region may be increased. The difference between lateral maxima and lateral minima may be reduced as the effect of lateral straggling on the lateral extension of the doping region may be better compensated with a smaller difference between the lateral dimensions of the implantation windows.

The doping region may extend to the surface of the semiconductor substrate or may be buried within the semiconductor substrate. For example, a minimal vertical distance of a border of the doping region (e.g. pn-junction to a neighboring doping region) and the front side surface of the semiconductor substrate may be at least 200 nm (or at least 300 nm or at least 400 nm) and/or at most 600 nm (or at most 500 nm). For example, a maximal vertical distance between the border of the doping portion of the doping region and the front side surface of the semiconductor substrate is at most 2.5 µm (or at most 2 µm or at most 1.5 µm).

The front side of the semiconductor substrate may be the side used to implement more sophisticated and complex structures than at a back side of the semiconductor substrate, since the process parameters (e.g. temperature) and the handling may be limited for the back side, if structures are already formed at one side of the semiconductor substrate, for example. For example, the vertical dimension or vertical distance and the thickness of layers may be measured orthogonal to the front side surface of the semiconductor substrate and a lateral direction and lateral dimensions may be measured in parallel to the front side surface of the semiconductor substrate.

For example, a scattering layer may be located within the first implantation window during implantation of the dopants through the first implantation window. A thickness of the scattering layer may be smaller than a thickness of the mask layer, for example the thickness of the scattering layer may be at most 70% (or at most 50% or at most 20%) of the thickness of the mask layer. The scattering layer may either comprise or consist of an oxide layer. Alternatively, the implantation window may be an area of the semiconductor substrate uncovered by the mask layer.

The method 100 may further comprise removing the mask layer after the implantation of the dopants through the second implantation window. For example, the mask layer may be removed after a last implantation process performed for forming the doping region.

For example, the method 100 may further comprise removing a surface layer of the semiconductor substrate after implanting dopants through the second implantation window. The surface layer may be removed after removing the mask layer. Alternatively, the surface layer may be removed before removing the mask layer, e.g. to facilitate the removal of the surface layer. The surface layer may be a vertical layer of the semiconductor substrate at the front side of the semiconductor substrate. The surface layer may have a thickness of at most 30 nm (or of at most 50 nm, of at most 70 nm or of at most 100 nm) and/or of at least 200 nm (or of at least 150 nm, or of at least 100 nm). By removing the surface layer, a more uniform doping region may be achieved, e.g. non-uniform parts of the vertical boundary of the doping region may be removed.

The first implantation energy may differ from the second implantation energy by at least 30 keV (or by at least 50 keV, by at least 100 keV, or by at least 200 keV) and/or by at most 1.8 MeV (or by at most 1.5 MeV, by at most 1.0 MeV, or by at most 0.5 MeV). For example, if a plurality of implantation processes is used, the implantation energy of the first implantation process (e.g. performed after providing the mask layer) may differ from the implantation energy of the last implantation process (e.g. before removing the mask layer) by at least 0.2 MeV (or by at least 0.5 MeV) and/or by at most 2 MeV.

According to at least one example of the method, the doping region is at least one of the following regions of a semiconductor device (in particular, a transistor or a diode) or is comprised by at least one of the following regions of a semiconductor device: an anode region, a cathode region, a base region, an emitter region, a source region, a drain region, a collector region, a body region, a gate region, a current spread region, a shielding region, and an edge termination region.

Furthermore, the doping region may be at least a part of a superjunction structure of a semiconductor device, in particular a transistor. The superjunction structure may be comprised by a drift zone of a semiconductor device. The drift zone may be n-doped and the superjunction structure may be p-doped. The superjunction structure may, for example, include at least one p-pillar.

In general, producing the doping region may include the following steps: (a) epitaxially growing at least a part of the semiconductor substrate, (b) forming a doping region by using the method described herein (in particular, with at least two implantation processes), (c) removing the mask layer from the part of the semiconductor substrate. At least some of the steps (a) to (c) may then be repeated. For example, a further part of the semiconductor substrate may be epitaxially grown on the part of the semiconductor substrate and further implantation processes may follow. With such a method, a deep doping region, e.g. a superjunction structure, may be formed in the semiconductor substrate.

For example, the doping region may be an anode region of a diode and/or a cathode region of a diode. The doping region may be a base region of a transistor and/or an emitter region of a transistor and/or a source region of a transistor and/or a drain region of a transistor. For example, a metal oxide semiconductor field effect transistor (MOSFET) may be formed using the method 100 comprising six implantation processes.

The semiconductor device to be formed may be a field effect transistor, e.g. a metal oxide semiconductor field effect transistor (MOSFET), or an insulated gate bipolar transistor (IGBT). For example, the proposed method 100 may be used for forming a semiconductor device or a wide band gap semiconductor device comprising at least a transistor or a transistor arrangement, for example a MOSFET and/or an IGBT. A gate of the transistor may be formed by a gate insulation layer and a gate electrode. The gate may be located in a gate trench extending into the semiconductor substrate or may be located on a lateral surface of the semiconductor substrate. For example, the semiconductor substrate may comprise one or more source regions, one or more body regions and a drift region of the transistor arrangement. The one or more source regions and the drift region may each have the same conductivity type. The one or more body regions may each be of the same conductivity type, which is opposite to the conductivity type of the source regions or the drift region. The one or more source regions and the drift region may each be n-type. The one or more body regions may be p-type. It is further possible for the semiconductor substrate to comprise a diode region, which may have the same conductivity type as the body region, and/or a current spread region, which may be of the same conductivity type as the drift region and/or the source region. The gate insulation layer may directly adjoin the semiconductor substrate. It is particularly possible for the gate insulation layer to directly adjoin regions of the semiconductor substrate that have a different conductivity type, for example, if applicable, the source region, the drift region, the body region, the current spread and/or the diode region.

The first conductivity type may be a p-doping (e.g. caused by incorporating aluminum ions or boron ions) or an n-doping (e.g. caused by incorporating nitrogen ions, phosphor ions or arsenic ions).

The transistor arrangement may be a vertical transistor structure conducting current between a front side surface of the semiconductor substrate and a back side surface of the semiconductor substrate. For example, the transistor arrangement of the semiconductor device may comprise a plurality of source doping regions connected to a source wiring structure, a plurality of gate electrodes or a gate electrode grid connected to a gate wiring structure and a back side drain metallization.

For example, the semiconductor substrate may be either one of a semiconductor base substrate, a semiconductor base substrate with a semiconductor epitaxial layer grown on the semiconductor base substrate or a semiconductor epitaxial layer. In one example, the semiconductor substrate may be a semiconductor wafer or a semiconductor die.

For example, the semiconductor substrate may be a wide band gap semiconductor substrate having a band gap larger than the band gap of silicon (1.1 eV). In particular, the wide band gap semiconductor substrate has a band gap larger than 2 eV, for example larger than 3 eV. For example, the wide band gap semiconductor substrate may be a silicon carbide semiconductor (SiC) substrate, diamond (C), or a gallium nitride (GaN) semiconductor substrate.

The semiconductor device to be formed may be a power semiconductor device. A power semiconductor device or an electrical structure (e.g. transistor arrangement of the semiconductor device and/or diode arrangement of the semiconductor device) of the power semiconductor device may have a breakdown voltage or blocking voltage of more than 10V (e.g. a breakdown voltage of 10 V, 20 V or 50V), more than 100 V (e.g. a breakdown voltage of 200 V, 300 V, 400 V or 500 V) or more than 500 V (e.g. a breakdown voltage of 600 V, 700 V, 800 V or 1 kV) or more than 1 kV (e.g. a breakdown voltage of 1.2 kV, 1.5 kV, 1.7 kV, 2 kV, 3.3 kV or 6.5 kV), for example.

Figure 2:
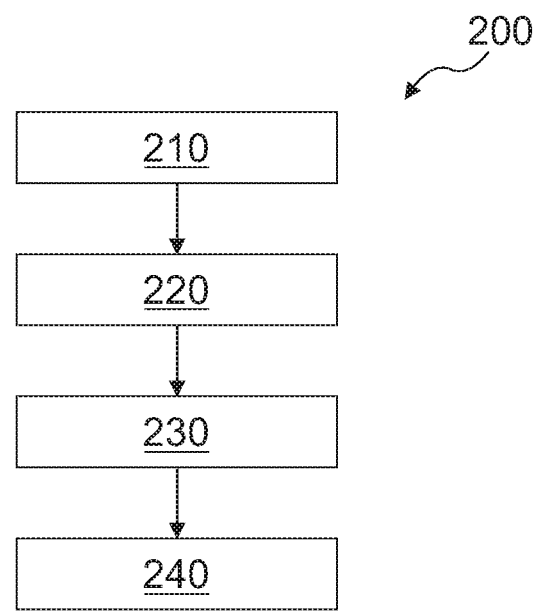
FIG. 2 shows a flow chart of a method for forming a semiconductor device comprising forming two mask layers on the semiconductor substrate.

FIG. 2 shows a flow chart of a method 200 for forming a semiconductor device. The method 200 may comprise forming at least two mask layers on a semiconductor substrate. For example, a first mask layer may be formed 210 on the semiconductor substrate. The first mask layer may comprise a first implantation window, for example of a first lateral dimension.

The method 200 may comprise implanting 220 dopants with a first implantation energy into the semiconductor substrate. The dopants may be implanted 220 through the first implantation window while the mask layer is located on the semiconductor substrate, e.g. to form a first portion of a doping region of the semiconductor substrate.

A second mask layer may be formed 230 on the semiconductor substrate. For example, the second mask layer may comprise a second implantation window differing from the first implantation window. The second implantation window may be larger than the first implantation window, for example. It may be possible to change the mask layer after implanting 220 dopants. For example, the mask layer comprising the first implantation window may be removed after implanting 220 dopants and the second mask layer, e.g. another mask layer, comprising the second implantation window may be formed 230 on the semiconductor substrate so that a lateral area of the second implantation window covers an area of the former first implantation window. For example, the first implantation window and the second implantation window may have a same center position on the semiconductor substrate.

The method 200 may further comprise implanting 240 dopants with a second implantation energy into the semiconductor substrate. The dopants may be implanted 240 through the second implantation window while the second mask layer is located on the semiconductor substrate to form a second portion of the doping region of the semiconductor substrate.

For example, a difference between a lateral dimension of the second implantation window and a lateral dimension of the first implantation window may be selected depending on a difference between the second implantation energy and the first implantation energy. The difference may be selected so that a maximal lateral dimension of the first portion differs from a maximal lateral dimension of the second portion by less than 5% of the maximal lateral dimension of the second portion. The implantation windows may be chosen according to the used implantation energies, e.g. to reduce an effect of lateral straggling on the lateral extension of the doping region.

For example, a plurality of doping portions may be formed, e.g. in alternation with forming respective mask layers with corresponding implantation windows. To form the complete doping region, at least two and/or at most seven different implantation processes may be performed using corresponding mask layers with different implantation windows, and different implantation energies. By using the method 200 a semiconductor device comprising at least one doping region with a more uniform vertical boundary may be formed.

More details and aspects are mentioned in connection with the embodiments described above or below. The embodiments shown in FIG. 2 may comprise one or more optional additional features corresponding to one or more aspects mentioned in connection with the proposed concept or one or more embodiments described above or below (e.g. FIG. 1 or 3-7).

Figure 3:
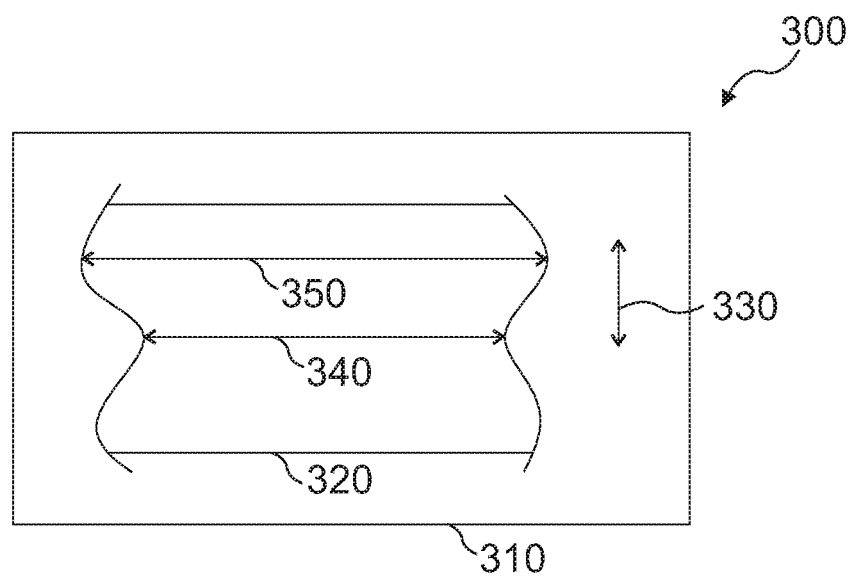
FIG. 3 shows a schematic cross section of a semiconductor device with a doping region comprising a minimal and a maximal lateral extension.

FIG. 3 shows a schematic cross section of a semiconductor device 300 with a doping region 320. The doping region 320 may have been formed by a method described herein. That is to say, all features described in connection with examples of the method may also be disclosed for the semiconductor device 300 and vice versa.

The semiconductor device 300 may comprise a semiconductor substrate 310. The doping region 320 may be located within the semiconductor substrate 310. A vertical extension 330 of a vertical portion of the doping region 320 may be at least 200 nm (or at least 350 nm, at least 500 nm, or at least 750 nm) and/or at most 1200 nm (or at most 900 nm, at most 600 nm or at most 400 nm). A minimal lateral dimension 340 of the doping region 320 within the vertical portion of the doping region 320 in a vertical cross-sectional area of the doping region 320 may be at least 80% (or at least 90%, or at least 95%) and/or at most 98% (or at most 95%) of an average lateral dimension within the vertical portion of the doping region 320. A maximal lateral dimension of the doping region 320 within the vertical portion of the doping region 320 may be at most 120% (or at most 110% or at most 105%) and/or at least 102% (or at least 105%) of the average lateral dimension of the doping region 320 within the vertical portion of the doping region 320.

For example, a difference between the maximal lateral dimension and the minimal lateral dimension of the doping region may be at most 100 nm (or at most 50 nm, at most 30 nm, at most 20 nm, or at most 10 nm).

A vertical boundary of the doping region 320 may be more uniform, e.g. compared to vertical boundaries of other doping regions. The doping region 320 may be formed by a plurality of implantation processes while e.g. adapting an implantation mask layer between the implantation processes. The doping region 320 may comprise a plurality of doping portions of a similar lateral dimension causing a reduced variation of the lateral extension of the doping region 320, for example within the vertical portion. The laterally uniform doping region 320 may be located laterally close to another doping region, e.g. closer compared to other doping regions, and a lateral size of a semiconductor device comprising the doping region 320 may be reduced.

For example, the semiconductor device 300 may comprise a plurality of doping regions 320 within a semiconductor substrate, wherein the conductivity of the doping regions 320 may be opposite to the conductivity of the semiconductor substrate. For example, a lateral dimension of the doping regions may be at least 0.5 μm (or at least 1 μm) and/or at most 2 μm (or at most 1.5 μm). A lateral distance between two of the plurality of doping regions may be at least 0.5 μm (or at least 1 μm) and/or at most 2 μm (or at most 1.5 μm), for example. By providing doping regions with more uniform vertical boundaries a distance between the doping regions within the semiconductor device may be reduced.

For example, the semiconductor substrate 310 of the semiconductor device 300 may be a wide band gap semiconductor substrate, e.g. a silicon carbide substrate.

More details and aspects are mentioned in connection with the embodiments described above or below. The embodiments shown in FIG. 3 may comprise one or more optional additional features corresponding to one or more aspects mentioned in connection with the proposed concept or one or more embodiments described above or below (e.g. FIG. 1-2 or 4-7).

Figure 4:
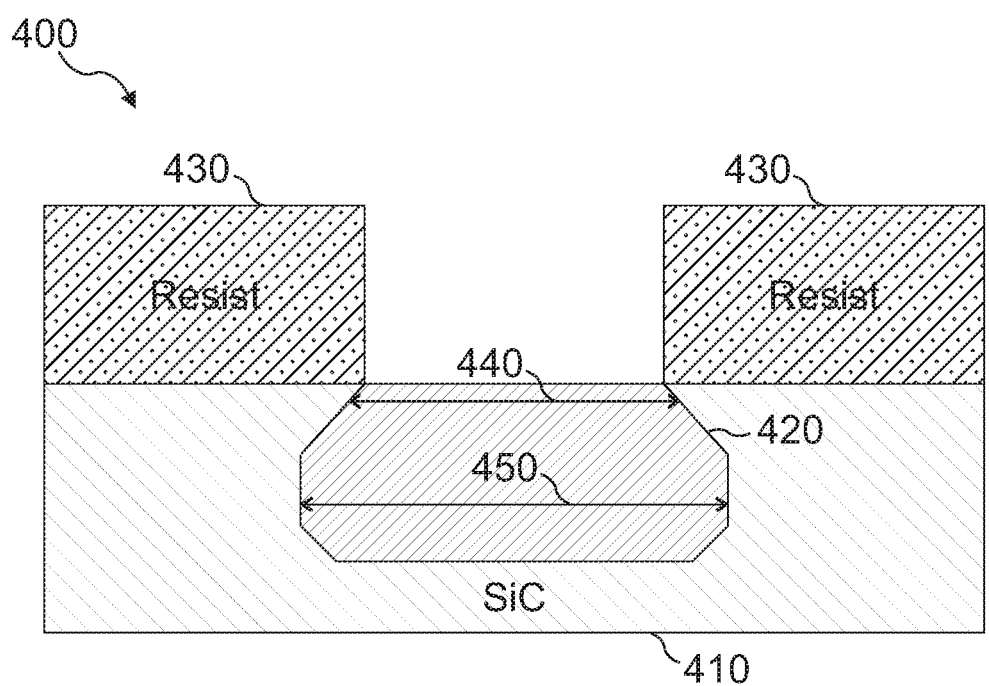
FIG. 4 shows a schematic cross section of a semiconductor device with a tapered lateral extension of a doping region of the semiconductor device.

FIG. 4 shows a schematic cross section of a semiconductor device 400 with a tapered lateral extension of a doping region 420 of the semiconductor device. The semiconductor device 400 may be a silicon carbide (SiC) semiconductor device with a SiC semiconductor substrate or a SiC semiconductor body, for example. A second lateral extension 450 may of the doping region 420 may differ from a first lateral extension 440 of the doping region 420 by more than 10% of the first lateral extension 440, for example. For example, a mask layer 430 (e.g., a resist mask) might not have been adapted during implantation processes for forming the doping region 420 so that the lateral profile of the doping region 420 may be relatively uneven or non-uniform. The doping region 420 may be formed by triple implantation via the mask layer 430, for example. Lateral straggling is illustrated schematically by the increasing lateral extension of the doping region with an increasing implantation depth or implantation dose, for example.

Figure 5A:
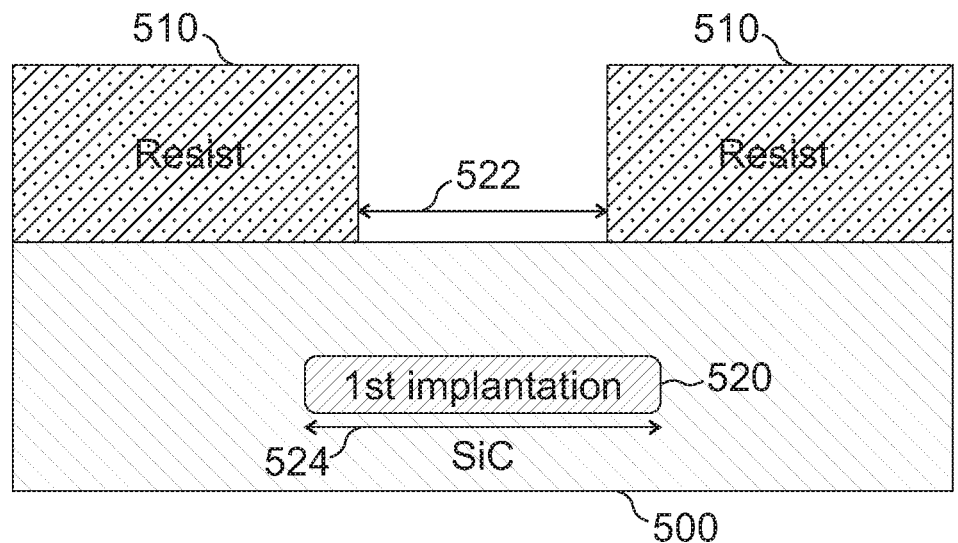
FIGS. 5a-5c show an example of forming a doping region using etch back of an implantation mask.
Figure 5B:
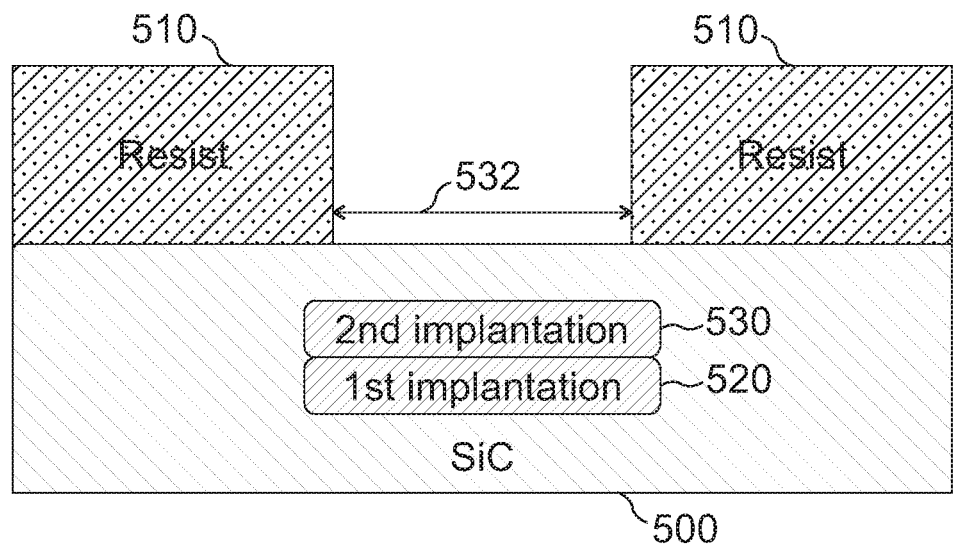
Figure 5C:
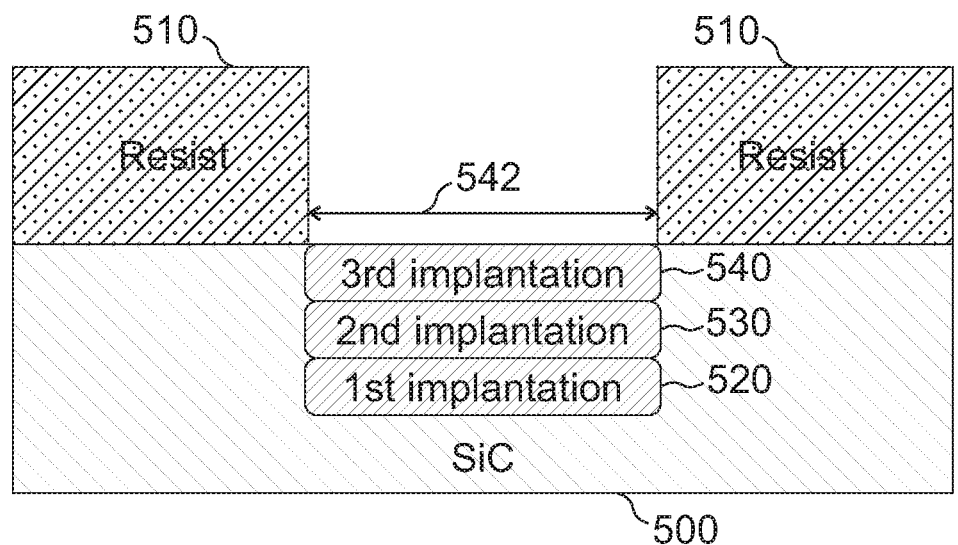

FIGS. 5a-c show an example of forming a doping region using etch back of an implantation mask (which may correspond to the mask layer describe herein). By adapting the implantation mask, variation of the lateral extension of the doping region may be reduced.

For example, by implanting dopants through an implantation window of an implantation mask 510 into a semiconductor substrate 500, e.g. a SiC semiconductor body, a first doping portion 520 (shown in FIG. 5a) of a doping region may be formed. To form the first doping portion 520, a first implantation energy and an implantation window of a first lateral dimension 522 may be used. The first doping portion 520 may have a first lateral extension 524. The first lateral extension 524 may be an average lateral extension of the first doping portion 520. For example, the implantation mask 510 may have a thickness high enough to provide a sufficient margin for subsequent etch back.

FIG. 5b shows the semiconductor substrate 500 after forming a second doping portion 530. The second doping portion 530 may be formed using a second implantation energy lower than the first implantation energy. A distance from the second doping portion 530 to a front side surface of the semiconductor substrate 500 may be lower than a distance from the first doping portion 520 to the front side surface of the semiconductor substrate 500. A lateral extension (e.g. an average lateral extension) of the second doping portion 530 may differ from the first lateral extension 524 by less than 10% (or less than 5%) of the first lateral extension 524. In other words, the first and second doping portion may have a similar lateral extension. The similar lateral extension may be achieved due to isotropic etch back of the implantation mask 510 before forming the second doping portion 530. By adapting the implantation mask, an implantation window of a second lateral dimension 532 larger than the first lateral dimension 522 may be provided, e.g. to compensate lateral straggling depending on the respective implantation energies.

For example, to form the doping region of the semiconductor substrate 500 a third doping portion 540 (shown in FIG. 5c) may be implanted into the semiconductor substrate 500 with a third implantation energy lower than the second implantation energy through the implantation window of a third lateral dimension 542 larger than the second lateral dimension 532. The doping region of the semiconductor substrate 500 may comprise the doping portions 520, 530, 540. For example, after removing the implantation mask (e.g. a resist mask) an upper SiC layer may be removed to then acquire a quasi-box-type implantation profile, e.g. of the doping region.

More details and aspects are mentioned in connection with the embodiments described above or below. The embodiments shown in FIGS. 5a-5c may comprise one or more optional additional features corresponding to one or more aspects mentioned in connection with the proposed concept or one or more embodiments described above or below (e.g. FIG. 1-4 or 6-7).

Figure 6:
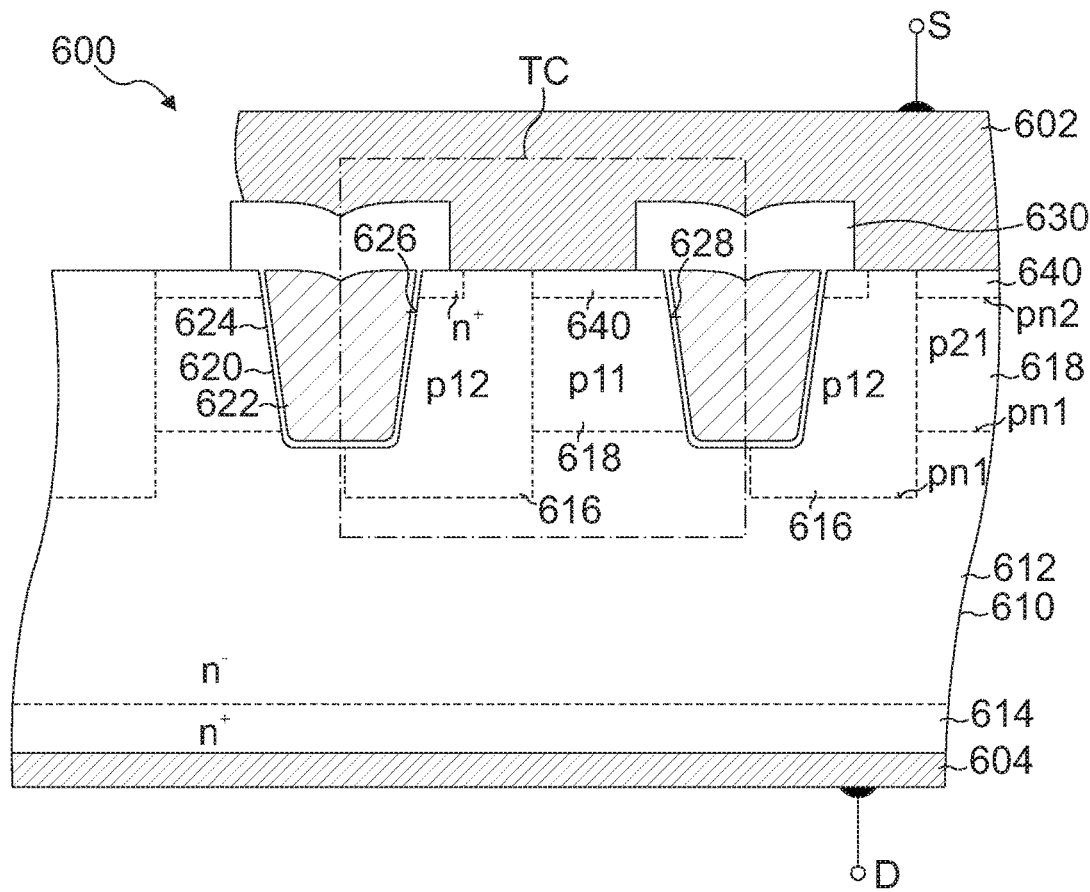
FIG. 6 shows a schematic cross section of a semiconductor device comprising a transistor.

FIG. 6 shows a schematic cross section of a semiconductor device 600 comprising a transistor. The semiconductor device 600 may comprise a first electrode 602 and a second electrode 604. The first electrode 602 may be a source connection S of the semiconductor device 600 and the second electrode 604 may be a drain connection D of the semiconductor device 600. A drift structure 610 may be located between the electrodes, the drift structure 610 comprising a drift portion 612, and a contact layer 614 connecting the drift portion and the second electrode 604, for example. P-doped regions 616, 618 may be located between the n-doped drift portion 612 and the first electrode 602, for example shielding regions 616 and body regions 618. The p-doped regions 616, 618 may separate a source region 640 from the drift structure 610. A maximal doping concentration p12 within the shielding regions 616 may be higher, e.g. at least 2 times (or at least 5 times) higher than a maximal doping concentration p11 within the body regions 618.

For example, the p-doped body region 618 and the n-doped source region 640 may have been implanted with a method described herein, wherein the same mask layer has been used for implantation. For this, at least two implantation processes may be used. For example, the n-doped source region 640 may be implanted in a first implantation process, wherein dopants of a first conductivity type (here: n-type dopants) are implanted with a first implantation energy through a first implantation window. The p-doped body region 618 may be implanted in at least one second implantation process, wherein dopants of a second conductivity type (here: p-type dopants) are implanted with at least one second implantation energy through at least one respective second implantation window.

Transistor cells TC of the semiconductor device 600 may be provided along gate structures 620 with a gate electrode 622 and a gate dielectric 624, for example. The gate structures 620 may be trench gate structures, e.g. a lateral extension of gate structure 620 along a first direction may be larger than a lateral extension of gate structure 620 along a second direction orthogonal to the first direction. For example, the gate structures 620 may be long trenches with a length of more than 100 µm, more than 1 mm or up to 5 cm. A right sidewall 626 and a left sidewall 628 may be adjacent to p-doped regions of the semiconductor device

600. The transistor cell TC may comprise an interlayer 630, e.g. between the gate electrode 622 and the first electrode 602.

The source region 640 may be (e.g. highly) n-doped and located between the first electrode 602 and the body region 618. For example, the source region 640 may be adjacent to the left sidewall 628 of the gate structure 620. For example, a highly n-doped portion $n^+$ may be located between the shielding region 616 and the first electrode 602, e.g. adjacent to the right sidewall 626 of the gate structure 620. For example, a lateral extension of the highly n-doped portion $n^+$ may be lower than a lateral extension of the shielding region, e.g. the highly n-doped portion $n^+$ might not extend to the source region 640. A junction pn1 indicates a pn-junction from the body region 618 to the drift structure 610 and a junction pn2 indicates a pn-junction from the body region 618 to the source region 640, for example.

For example, the shielding regions 616 and/or the body regions 618 may be formed by a proposed method (e.g. as described in connection with FIG. 1, 2 or 5a-5c) and/or may comprise a proposed structure (e.g. as described in connection with FIG. 3).

More details and aspects are mentioned in connection with the embodiments described above or below. The embodiments shown in FIG. 6 may comprise one or more optional additional features corresponding to one or more aspects mentioned in connection with the proposed concept or one or more embodiments described above or below (e.g. FIG. 1-5c or 7).

Figure 7:
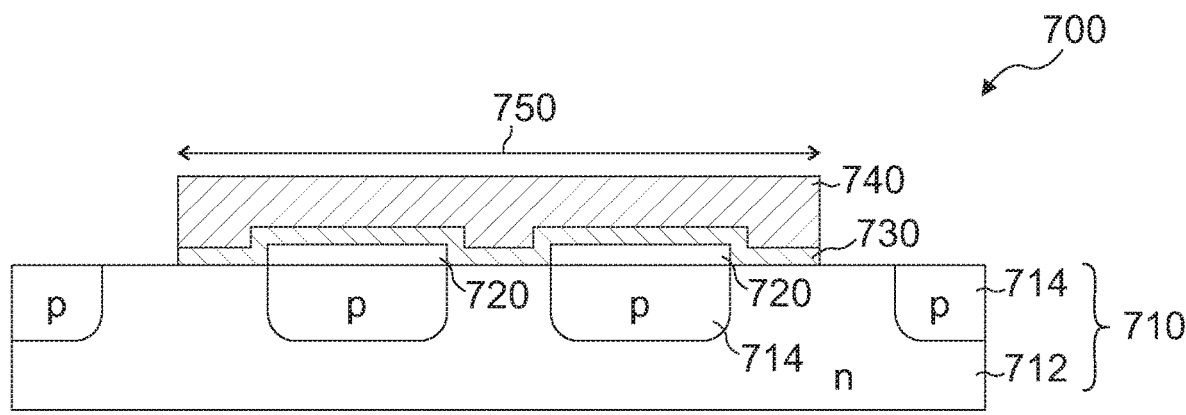
FIG. 7 shows a schematic cross section of a semiconductor device comprising a diode.

FIG. 7 shows a schematic cross section of a semiconductor device 700 comprising a Merged-PIN-Schottky diode. The semiconductor device 700 may comprise a semiconductor substrate 710 comprising an n-doped cathode region 712 extending to a back side surface of the semiconductor substrate 710 and p-doped anode regions 714 at a front side surface of the semiconductor substrate 710, for example. A contact metallization 720 may be in contact with the p-doped anode regions 714 at the front side surface. An ohmic contact may exist between the contact metallization 720 and the p-doped anode regions 714. Further, a Schottky metallization layer 730 may be in contact with the n-doped cathode region 712 at the front side surface of the semiconductor substrate between the p-doped anode regions 714. A Schottky contact may exist between the Schottky metallization layer 730 and the n-doped cathode region 712. A power metallization layer 740 may be located on the Schottky metallization layer 730. The contact metallization 720, the Schottky metallization layer 730 and the power metallization layer 740 may form an anode metallization within an active region 750 of the semiconductor device 700.

For example, the p-doped anode regions 714 may be formed by a proposed method (e.g. as described in connection with FIG. 1, 2 or 5a-5c) and/or may comprise a proposed structure (e.g. as described in connection with FIG. 3).

More details and aspects are mentioned in connection with the embodiments described above or below. The embodiments shown in FIG. 7 may comprise one or more optional additional features corresponding to one or more aspects mentioned in connection with the proposed concept or one or more embodiments described above or below (e.g. FIGS. 1-6).

For example, when implanting aluminum (Al) atoms into a SiC semiconductor substrate, a lateral straggle may increase with increasing implantation energy. A maximal lateral straggle at an implantation energy of 80 keV may be 35 nm, a maximal lateral straggle at an implantation energy of 200 keV may be 70 nm, a maximal lateral straggle at an implantation energy of 700 keV may be 180 nm, and a maximal lateral straggle at an implantation energy of 1800 keV may be 300 nm, for example. The maximal lateral straggle may be computed by using transport of ions in matter (TRIM) simulations, for example. The implantation window may be adapted based on the respective calculated lateral straggle, for example.

An example relates to laterally sharpening of the implantation profile in SiC by successive etch back of the mask layer (e.g., a resist mask). By etching the mask layer, an inhomogeneous profile may be avoided, and accordingly an inhomogeneous extent of the implantation profile might not have to be accommodated in the layout.

In some implantation concepts, the lateral extension may depend on the implantation energies (e.g. dopant depths) and may differ. For example, inhomogeneous potential ratios may occur along the implantation courses using some concepts. For example, in some concepts current filamentation may occur e.g. in case of a horizontal current flow as the cross section may vary due to the different extent of doping.

For example, the semiconductor device may be a SiC Schottky diode. For example, manufacturing the semiconductor device may comprise triple ion implantation in a cell field. After the completion of a mask layer, e.g. the deepest implantation may take place. The average lateral straggling may be known from TRIM calculations, for example. The mask layer may be etched back by the calculated amount. For example, the mask layer may be big enough so that the resulting edge rounding may have no effect on the implantation profile in the semiconductor. For example, a second implantation may take place. Also, a lateral straggling may occur, which may have a decreased extent due to the decreased ion energy. The resist may be etched back by this extent to complete the implantation in a third implantation process, for example. In this way, a more homogenous implantation profile may be acquired regarding an average extent of lateral straggling.

Alternatively, for example, a first dopant (e.g. p-doping) may be introduced overall followed by dry-chemically etching the structure. For example, a second dopant (e.g. n-doping) may be grown over etched trenches.

The aspects and features mentioned and described together with one or more of the previously detailed examples and figures, may as well be combined with one or more of the other examples in order to replace a like feature of the other example or in order to additionally introduce the feature to the other example.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof

What is claimed is:

1. A method for forming a semiconductor device, the method comprising:
    forming a mask layer comprising a first implantation window on a semiconductor substrate;
    implanting dopants with a first implantation energy into the semiconductor substrate through the first implantation window to form a first portion of a doping region of the semiconductor device;
    adapting the mask layer to form a second implantation window of the mask layer; and
    implanting dopants with a second implantation energy into the semiconductor substrate through the second implantation window to form a second portion of the doping region of the semiconductor device, the second implantation energy being different from the first implantation energy, and
    selecting a lateral dimension of the first implantation window to be different from a lateral dimension of the second implantation window so as to compensate for a difference in lateral straggling of dopants implanted at the first implantation energy and dopants implanted at the second implantation energy thereby reducing a difference in lateral dimensions of the first and second portions that is attributable to the difference in lateral straggling.

2. The method of claim 1, wherein the second implantation energy is lower than the first implantation energy and/or wherein the lateral dimension of the second implantation window is larger than the lateral dimension of the first implantation window.

3. The method of claim 1, wherein the second implantation energy is higher than the first implantation energy and/or wherein the lateral dimension of the second implantation window is smaller than the lateral dimension of the first implantation window.

4. The method of claim 1, wherein the dopants implanted with the first implantation energy and the dopants implanted with the second implantation energy are of a first conductivity type.

5. The method of claim 1, wherein a difference between the lateral dimension of the second implantation window and the lateral dimension of the first implantation window depends on a difference between the second implantation energy and the first implantation energy.

6. The method of claim 1, wherein a difference between the lateral dimension of the first implantation window and the lateral dimension of the second implantation window is at least 20 nm and at most 200 nm.

7. The method of claim 1, wherein a lateral area of the second implantation window contains a lateral area of the first implantation window.

8. The method of claim 1, wherein adapting the mask layer comprises etching the mask layer to increase the lateral dimension of the first implantation window to obtain the second implantation window.

9. The method of claim 1, wherein adapting the mask layer comprises forming a spacer at an edge of the first implantation window to decrease the lateral dimension of the first implantation window to obtain the second implantation window.

10. The method of claim 1, wherein a scattering layer is located within the first implantation window during implantation of the dopants through the first implantation window.

11. The method of claim 1, further comprising:
    adapting the mask layer to form a third implantation window of the mask layer; and
    implanting dopants with a third implantation energy into the semiconductor substrate through the third implantation window to form a third portion of the doping region of the semiconductor device,
    wherein the third implantation energy differs from the first implantation energy and the second implantation energy,
    wherein a lateral dimension of the third implantation window differs from the lateral dimension of the first implantation window and the second implantation window.

12. The method of claim 1, wherein the mask layer has a thickness of at least 1.5 μm before adapting the mask layer to obtain the second implantation window.

13. The method of claim 1, wherein the first implantation energy differs from the second implantation energy by at least 50 keV and by at most 2.5 MeV.

14. The method of claim 1, wherein the semiconductor substrate is a silicon carbide substrate, a gallium arsenide substrate, or a gallium nitride substrate.

15. The method of claim 1, wherein the doping region is at least one of or a part of an anode region of a semiconductor device, a cathode region of a semiconductor device, a base region of a semiconductor device, an emitter region of a semiconductor device, a source region of a semiconductor device, a drain region of a semiconductor device, a collector region of a semiconductor device, a body region of a semiconductor device, a gate region of a semiconductor device, a current spread region of a semiconductor device, a shielding region of a semiconductor device, and an edge termination region of a semiconductor device.

16. The method of claim 1, wherein a maximal lateral dimension of the first portion of the doping region differs from a maximal lateral dimension of the second portion of the doping region by less than 5% of the maximal lateral dimension of the second portion of the doping region.

17. The method of claim 1, wherein the difference in lateral dimensions between the first and second implantation windows is selected such that the lateral dimensions of the first and second portions substantially match one another.

* * * * *